United States Patent [19]
Ruijs

[11] Patent Number: 4,920,322
[45] Date of Patent: Apr. 24, 1990

[54] VOLTAGE CONTROLLED R-C OSCILLATOR AND PHASE LOCKED LOOP

[75] Inventor: Jan B. F. W. Ruijs, Hilversum, Netherlands

[73] Assignee: AT&T Philips Telecommunications, Hilversum, Netherlands

[21] Appl. No.: 314,532

[22] Filed: Feb. 23, 1989

[30] Foreign Application Priority Data

Feb. 25, 1988 [NL] Netherlands .................. 8800480

[51] Int. Cl.$^5$ .................. H03B 5/20; H03K 3/03; H03K 7/06; H03L 7/08
[52] U.S. Cl. ................................. 331/17; 331/34; 331/57; 331/135; 331/143; 331/177 R
[58] Field of Search ............... 331/135, 137, 111, 143, 331/177 R, 17, 34, 57, 1 A

[56] References Cited

U.S. PATENT DOCUMENTS 4,146,849  3/1979  Satou .................................. 331/111

OTHER PUBLICATIONS

Dean et al., RCA Application Note ICAN-6267, Mar. 1971, pp. 353-360.
Rice, "XOR Gate Controls Oscillator Frequency", EDN, Apr. 14, 1982, p. 196.

Primary Examiner—Siegfried H. Grimm
Attorney, Agent, or Firm—Peter Visserman

[57] ABSTRACT

A voltage controlled oscillator (VCO) comprises the series arrangement of two signal inverters whose outputs are coupled to the input of the first signal inverter through a feedback loop, and a control circuit including a series arrangement of two diodes arranged in the same direction, whose interconnected electrodes are coupled to the input of the first inverter. The other electrodes of the diodes form inputs for two control voltages with which the frequency of the VCO can be varied over a continuous range. The VCO is used in a phase locked loop which includes a phase detector for generating an error signal representative of a phase difference between a reference signal and a signal taken from the VCO, and a loop filter for producing a control signal from the error signal. The phase detector is arranged as an EXOR gate with a first input for the reference signal voltage and a second input for the output voltage of the VCO. The phase detector has an output which is connected to one of the control inputs of the VCO through a first passive low-pass filter, and to the other control input of the VCO through an EXOR gate, operating as a logic signal inverter, and a subsequent second passive low-pass filter, corresponding with the first filter.

3 Claims, 3 Drawing Sheets

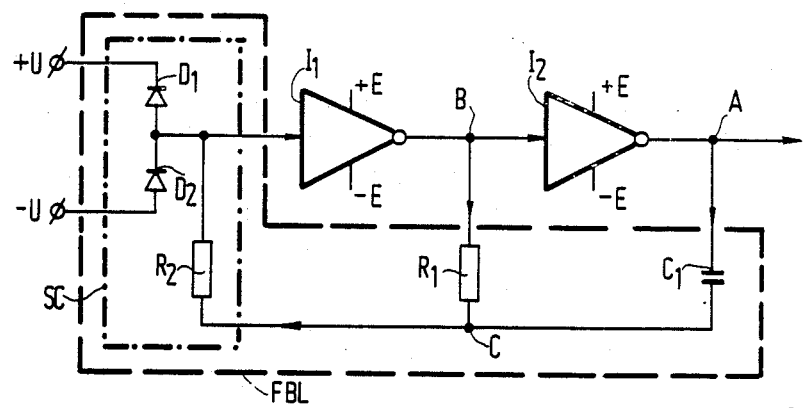
PRIOR ART FIG. 3
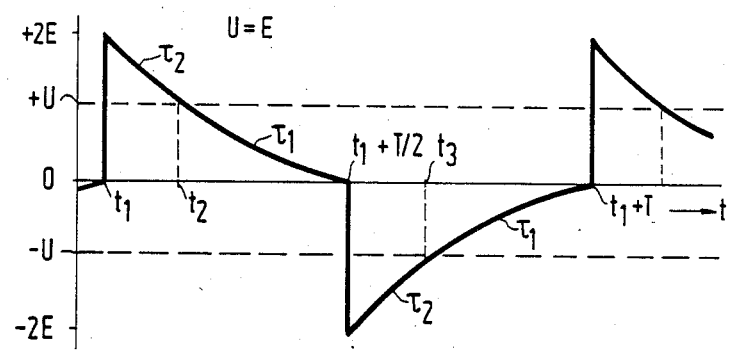
FIG. 4A
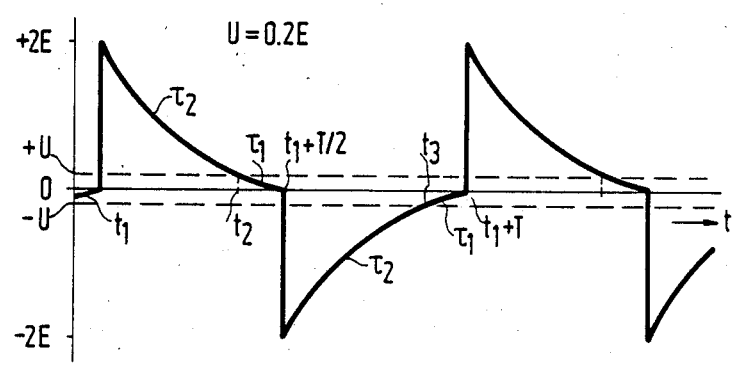
FIG. 4B

12345678901234567890

VOLTAGE CONTROLLED R-C OSCILLATOR AND PHASE LOCKED LOOP

The invention relates to a voltage controlled oscillator, comprising:
a series arrangement of a first and a second signal inverter, each signal inverter producing a substantially binary signal with preset voltage levels and the output of the second signal inverter operating as the output of the oscillator; and
a feedback loop comprising:
a resistor whose one end is connected to the output of the one signal inverter and a capacitor whose one end is connected to the output of the other signal inverter and whose remaining interconnected ends are connected to the input of the first signal inverter through a coupling circuit; and
a control circuit for varying the frequency of the oscillator over a continuous range in accordance with a continuously variable control voltage.

BACKGROUND OF THE INVENTION

Voltage controlled oscillators (VCO's) of this type can be used as independent voltage to frequency converters, but are especially used as parts of control systems such as phase-locked loops (PLL's).

A VCO of the type mentioned hereinbefore is known from U.S. Pat. No. 4,146,849. In this known VCO the feedback loop comprises a third signal inverter for coupling the junction of the capacitor and the resistor, which are connected to the output of the first and the second signal inverter, respectively, to the input of the first signal inverter. The three signal inverters are designed in complementary MOS technology (CMOS), the second CMOS signal inverter being arranged between complementary MOS field effect transistors (CMOS FET's) which are connected to the respective supply voltages and function as resistors whose values can be modified with the aid of two oppositely varying control voltages at their gate electrodes. Thus, the output resistance of the second CMOS signal inverter can be modified externally and hence the frequency of the signal generated by the VCO. At a given value of the control voltages, however, the oscillation frequency still depends rather strongly on the properties of the CMOS FET's and, more specifically, on the so-called "pinch-off voltage", the threshold of the gate voltage at which a FET just begins to be conductive. For a FET having the same channel type as well as for the FET's having a complementary channel type, this "pinch-off voltage" shows a relatively large variation, whilst the deviations with respect to the nominal value can be ±0.8 Volt in practice and thus the accidental value of the difference may rise to 1.6 Volts. In addition, with this VCO the charging and discharging of the capacitor in each oscillation period takes place via the output resistor of the second CMOS signal inverter which is determined during the charging operation by the resistance of the FET of the one channel type and during the discharging operation by the resistance of the FET of the other channel type. For obtaining the practically desired symmetrical signal shape of the oscillator signal (that is to say, a signal having a duty factor of 50%) additional provisions are required for this VCO in order to neutralize accidental inequalities in the charging and discharging resistors.

SUMMARY OF THE INVENTION

The invention has for its object to provide a voltage controlled oscillator of the type mentioned in the preamble which is suitable for use in a wide range of frequency values and has an easily implementable control circuit, the active elements of the signal inverters in this oscillator having substantially no effect on the control of the oscillation frequency by the control voltages and no particular provisions being required for obtaining a practically symmetrical signal shape of the oscillator signal.

The voltage controlled oscillator according to the invention is characterized in that the control circuit forms a part of the coupling circuit and comprises:
a second resistor whose one end is connected to the interconnected ends of the first resistor and the capacitor; and
a series arrangement of two equally directed diodes, whose interconnected electrodes are connected to the other end of the second resistor and whose remaining electrodes form the respective control inputs for two oppositely varying control voltages having a symmetrical position with respect to the mean value of the voltage in the interconnected ends of the first resistor and the capacitor, the interconnected electrodes of the diodes being coupled to the input of the first signal inverter.

By implementing the measures according to the invention, it is achieved that both the charging and the discharging of the capacitor is effected via the first resistor (thus with a first time constant) when the capacitor voltage is situated in the range between the two control voltages, and that both the charging and the discharging of the capacitor is effected via the first and via the second resistor (thus with a second, smaller time constant) when the capacitor voltage is situated outside the range between the two control voltages. While maintaining a symmetrical signal shape, the frequency of the oscillator signal can be varied by varying the two control voltages symmetrically with respect to the mean values of the capacitor voltage, so that the width of the voltage range for the charging and discharging of the capacitor according to the first, larger time constant is increased or reduced symmetrically and hence also the duration of an oscillation period is varied accordingly. The signal inverters used in practice generally have such a low output impedance that their active elements have substantially no effect on the control of the oscillation frequency by the control voltages. The latter also holds for the two diodes of the control circuit, since the characteristics of two diodes of the second type generally show few differences and these differences can practically be disregarded for two diodes from one and the same wafer.

The signal inverters used in the present VCO can be realized in a known manner as hard-limiting inverting amplifiers, the voltage levels of the binary output voltage being determined by the two supply voltages of the amplifier. These signal inverters can also be realized as inverting logic gates.

An embodiment of the VCO according to the invention which is attractive for use in a phase-locked loop (PLL), is characterized in that each of the signal inverters is arranged as an EXOR gate having two inputs, a direct voltage representing a logic value "1" being constantly present at the one input and the other input constituting the signal input proper. The use of a VCO applied thus enables one to implement the PLL as a whole by utilizing four EXOR gates, a pair of diodes and further only resistors and capacitors. The phase detector of this PLL is arranged as an EXOR gate having two inputs, a binary reference signal voltage being present at the input and the binary output voltage of the VCO at the other input, and a binary error voltage which is representative of a phase difference between the binary reference signal voltage and the binary VCO output voltage occurring at the output of this EXOR gate. In this PLL the binary error voltage is logically inverted with the aid of a signal inverter which again is arranged as an EXOR gate having two inputs, a direct voltage representing a logic value "1" being permanently present at the one input and the error voltage to be inverted being present at the other input. The error voltage and the logically inverted error voltage are applied to identically arranged RC low-pass filters for producing the respective control voltages for the VCO. With this use of the PLL only a single specimen of a current type of integrated circuit which is known by the name of "Quad EXOR Gate" and comprises four EXOR gates will suffice. Such "Quad EXOR Gates" are available as standard components in known circuit techniques, including the ECL technique which is suitable for use in the frequency range of the order of 100 MHz.

BRIEF DESCRIPTION OF THE DRAWINGS

The invention and its advantages will now be further explained in the following description of embodiments with reference to the drawings, in which:

FIG. 3 shows a circuit diagram of the first embodiment of a VCO according to the invention;

FIGS. 4A and 4B show two time diagrams to explain the operation of the VCO in FIG. 3;

DETAILED DESCRIPTION

Figure 1:
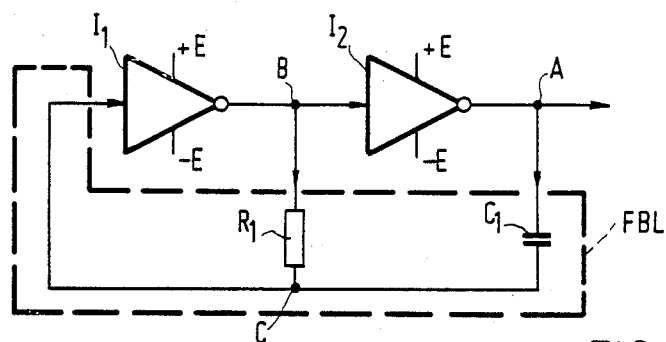
FIG. 1 shows a circuit diagram of a prior art fixed frequency oscillator forming the basis for a first embodiment of a VCO according to the invention.

The fixed frequency basic oscillator shown in FIG. 1 comprises a series arrangement of two signal inverters $I_1$ and $I_2$, the output A of the second signal inverter $I_2$ also constituting the output of the oscillator. This oscillator further comprises a positive feedback loop FBL with a resistor $R_1$ and a capacitor $C_1$ which are connected to the output B of the first signal inverter $I_1$ and the output A of the second signal inverter $I_2$, respectively, the junction C of the capacitor $C_1$ and the resistor $R_1$ being directly connected to the input of the first signal inverter $I_1$. The inverters $I_1$ and $I_2$ are arranged as hard-limiting inverting amplifiers, in which the voltage levels of the binary output voltage are provided by the positive supply voltage $+E$ and the equally large negative supply voltage $-E$, and in which the threshold voltage at the input has the mean value of these supply voltages and thus has the value 0.

Figure 2A:
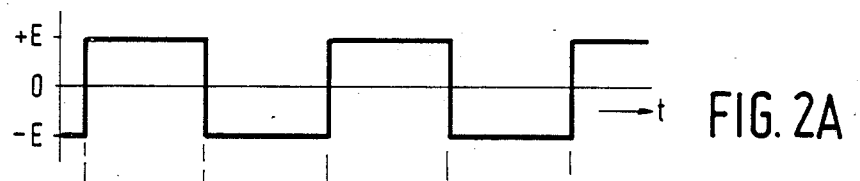
FIGS. 2A, 2B and 2C show three time diagrams to explain the operation of the oscillator in FIG. 1.
Figure 2B:
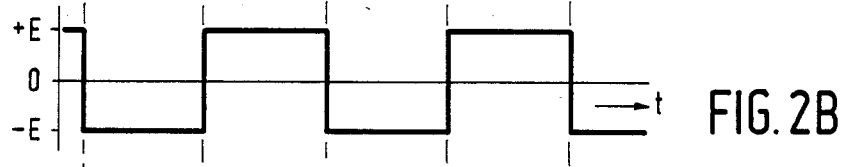
Figure 2C:
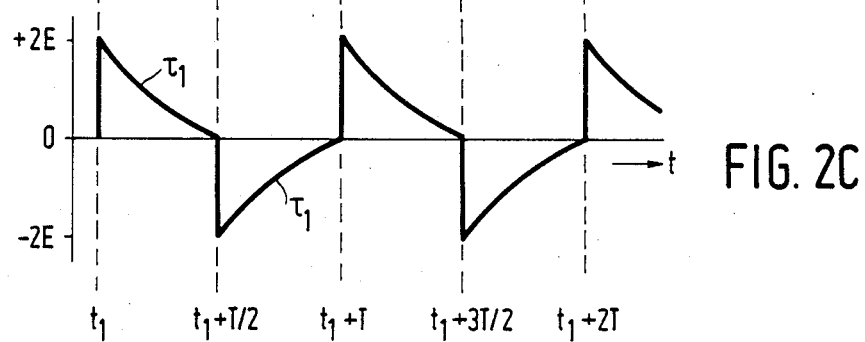

The operation of the basic oscillator is illustrated with the aid of the time diagrams of FIGS. 2A, 2B and 2C for the substantially ideal case of signal inverters having a very high input impedance, a very high gain and a very low output impedance. FIG. 2A shows the binary voltage at output A of the second signal inverter $I_2$ for voltage levels $-E$ and $+E$. FIG. 2B shows the binary voltage at output B of the first inverter $I_1$ for voltage levels $-E$ and $+E$. FIG. 2C shows in a stylized form the variation of the voltage in the junction C whose mean value is equal to the mean value 0 of the voltage at output B of the first inverter $I_1$. At the instant $t=t_1$, at which the voltage in junction A jumps from the value $-E$ to the value $+E$ and that in junction B from the value $+E$ to the value $-E$, the voltage in junction C jumps from the mean value 0 to the value $+2E$, so that the voltage difference between the junctions C and B has the value $+3E$. After the instant $t=t_1$ the capacitor $C_1$ is discharged through the resistor $R_1$ with a time constant $\tau_1 = R_1 C_1$. This discharging is continued until at an instant $t=t_1+T/2$ the voltage in junction C reaches the value 0 forming the threshold voltage for inverter $I_1$, resulting in the voltage at the output B of inverter $I_1$ jumping from the value $-E$ to the value $+E$ at this instant. Consequently, also at this instant, the voltage in junction A moves from the value $+E$ to the value $-E$. This voltage jump of $-2E$ in junction A is conveyed unchanged to junction C so that the voltage difference between the junctions C and B now has the value $-3E$. After the instant $t=t_1+T/2$ the capacitor $C_1$ is charged through resistor $R_1$ again with the time constant $\tau_1 = R_1 C_1$. The charging and the discharging of the capacitor $C_1$ is thus effected with the same time constant. At instant $t=t_1+T$ the voltage in junction C has again reached the value 0 and the voltage at output B of inverter $I_1$ will jump from the value $+E$ to the value $-E$ at instant $t=t_1+T$, after which the process of discharging and charging described hereinbefore will be repeated with the period T.

Since the charging and discharging of capacitor $C_1$ is effected symmetrically, the period T of the oscillator voltage can be simply determined with the aid of FIG. 2C by choosing for $t_1$ the reference instant $t_1=0$. At instant $t=0$ there is across resistor $R_1$ a voltage of $+3E$ which decreases exponentially according to $\exp[-t/\tau_1]$ until, after a half oscillation period, there is a voltage with a value $+E$ across resistor $R_1$ at instant $t=T/2$, so that the following holds:

$$3E \exp[-T/(2\tau_1)] = E$$

from which it follows that the oscillation period T is provided by the relationship:

$$T = (2\tau_1) \ln 3 = (2R_1 C_1) \ln 3.$$

From this formula it appears that the frequency $f=1/T$ of the output voltage of the oscillator in FIG. 1 can be changed by changing the value of resistor $R_1$ or that of capacitor $C_1$. A voltage controlled oscillator (VCO) having a frequency $f=1/T$ which is varied over a continuous range, can thus be obtained by providing the oscillator of FIG. 1 with a control circuit which, for example, varies the value of resistor $R_1$ according to a continuously variable control voltage.

The invention now provides a VCO whose frequency $f=1/T$ can be varied over a continuous range without utilizing continuously variable resistors or capacitors.

A first embodiment of the VCO according to the invention which is based on the oscillator in FIG. 1, is represented in FIG. 3. In FIG. 1 and FIG. 3 the corresponding elements are denoted by the same reference numerals.

According to the invention, the VCO in FIG. 3 comprises a control circuit SC which couples the junction C of capacitor $C_1$ and resistor $R_1$ to the input of the first signal inverter $I_1$. This control circuit SC comprises a second resistor $R_2$ connected on one end to the junction C, and further includes the series arrangement of two diodes $D_1$ and $D_2$ arranged in the same direction, whose interconnected electrodes are connected to the other end of resistor $R_2$ and also to the input of the first signal inverter $I_1$. The two remaining electrodes of these diodes $D_1$, $D_2$ form respective control inputs for two control voltages varying in opposite directions with the values $+U$ and $-U$ which are symmetrical with respect to the average value 0 of the capacitor voltage at junction C and the value 0 of the threshold voltage of the first signal inverter $I_1$.

The operation of the VCO according to FIG. 3 will now be explained with reference to the time diagrams of FIGS. 4A and 4B. This explanation is based on a number of suppositions forming a realistic approach to the practical situation. For example, it is again assumed that the inverters $I_1$ and $I_2$ are substantially ideal inverters having a very high input impedance, a very high gain and a very low output impedance. It is also assumed that the diodes $D_1$ and $D_2$ have substantially ideal diode characteristics with a negligible forward voltage and a negligible reverse current. It is further assumed that the control voltages $+U$ and $-U$ are supplied by substantially ideal voltage sources having an extremely low internal impedance.

The binary voltages at the outputs A and B of the two inverters $I_2$ and $I_1$ again have the shape which is represented in the respective time diagrams of FIG. 2A and FIG. 2B. The voltage in the junction C of resistor $R_1$ and capacitor $C_1$ again has a mean value equal to the mean value 0 of the voltage in junction B, but has a shape different from the one represented in the time diagram of FIG. 2C in the case of FIG. 1. This different shape of the voltage in junction C of the VCO according to FIG. 3 is represented in FIGS. 4A and 4B in a scaled-up manner for two different magnitudes of the two control voltages $+U$ and $-U$, in which Figure stylization is again used for clarity.

In the time diagram of FIG. 4A the two control voltages have a magnitude E so that it holds that $+U=+E$ and $-U=-E$. At the instant $t=t_1$, at which the voltage in junction A jumps from the value $-E$ to the value $+E$ and in junction B from the value $+E$ to the value $-E$ (compare FIG. 2A and FIG. 2B), the voltage in junction C of FIG. 3 jumps from the mean value 0 to the value $+2E$, so that the voltage difference between the junctions C and B then has the value $+3E$. Since voltage in junction C at the instant $t=t_1$ has a value $+2E$ which exceeds the voltage at the control input of diode $D_1$ having a value of $+U=+E$, diode $D_1$ will be conductive. On the other hand, diode $D_2$ will not be conductive because the voltage at its control input with a value of $-U=-E$ is lower than the value $+2E$ of the voltage in junction C. After the instant $t=t_1$ capacitor $C_1$ will be discharged via resistor $R_1$ as well as via resistor $R_2$ and the time constant $\tau_2$ of this discharge is given by:

$$\tau_2 = R_1 R_2 C_1 / (R_1+R_2).$$

This time constant $\tau_2$ thus has a smaller value than the time constant $\tau_1 = R_1 C_1$. The discharging of capacitor $C_1$ with the time constant $\tau_2$ is continued till the instant $t=t_2$, at which the voltage is equal to the control voltage $+U=+E$ of diode $D_1$ and diode $D_1$ is no longer conductive.

After this instant $t=t_2$ the two diodes $D_1$ and $D_2$ are non-conductive, so that capacitor $C_1$ can then be further discharged only through resistor $R_1$ with a time constant $\tau_1 = R_1 C_1$. This discharging is continued till the instant $t=t_1+T/2$, at which the voltage in junction C reaches the value 0 of the threshold voltage of inverter $I_1$, resulting in the voltage in junction B jumping from the value $-E$ to the value $+E$ and that in junction A from the value $+E$ to the value $-E$. The latter voltage jump of $-2E$ in junction A is conveyed unchanged to junction C, so that the voltage in junction C jumps from the mean value 0 to the value $-2E$ and the voltage difference between the junctions C and B then has the value $-3E$. Since just after the instant $t=t_1+T/2$ the voltage in junction C has a value $-2E$, which is lower than the control voltage $-U=-E$ of diode $D_2$, diode $D_2$ will be conductive, whereas diode $D_1$ remains non-conductive because the voltage $+U=+E$ at its control input exceeds the voltage in junction C.

After the instant $t=t_1+T/2$ capacitor $C_1$ will be charged through resistor $R_1$ as well as resistor $R_2$, so that this charging operation is effected again with the time constant $\tau_2$. This charging operation of capacitor $C_1$ with time constant $\tau_2$ is continued till the instant $t=t_3$, at which the voltage in junction C is equal to the control voltage $U=-E$ of diode $D_2$ and diode $D_2$ is no longer conductive. After this instant $t=t_3$ both diodes $D_1$ and $D_2$ are non-conductive and capacitor $C_1$ is charged only through resistor $R_1$ and thus again with the time constant $\tau_1 = R_1 C_1$ till the instant $t=t_1+T$, at which the voltage in junction C again reaches the value 0 of the threshold voltage of inverter $I_1$, resulting in the voltage in junction B jumping from the value $+E$ to the value $-E$ and that in junction A from the value $-E$ to the value $+E$. The process of the discharging and charging of capacitor $C_1$ as described for the time interval $(t_1, t_1+T)$ will repeat itself with a period T after the instant $t=t_1+T$.

The above has shown that both the charging and the discharging of capacitor $C_1$ is effected through the fixed resistors $R_1$ and $R_2$, that is to say, through resistor $R_1$ (and thus with the time constant $\tau_1 = R_1 C_1$) when the voltage in junction C is situated in the range between the control voltages $+U$ and $-U$ (thus for the time intervals $(t_2, t_1+T/2)$ and $(t_3, t_1+T)$), but through both resistors $R_1$, $R_2$ (and thus with the time constant $\tau_2$ which is smaller than $\tau_1$) when the voltage in junction C is situated outside the range between the control voltages $+U$ and $-U$ (thus for the time intevals $(t_1, t_2)$ and $(t_1+T/2, t_3)$. Since these control voltages are situated symmetrically with respect to the mean value 0 of the capacitor voltage and the value 0 of the threshold voltage of the converter $I_1$, the capacitor voltage in FIG. 4A has a symmetrical signal shape and the same holds for the signal shape of the binary voltage at the output A of the VCO in FIG. 3. Thus, in the VCO according to the invention no particular provisions are required for the in practice desired symmetrical signal shape of the oscillator signal (that is to say, a binary signal with a 50% duty factor).

FIG. 4B likewise shows the shape of the capacitor voltage, but in this case the two control voltages have a smaller magnitude than in FIG. 4A, that is, a magnitude of 0.2E so that in FIG. 4B it holds that $+U=+0.2E$ and $-U=-0.2E$. The process of the charging and the discharging of the capacitor $C_1$ proceeds in the same way as in FIG. 4A, but owing to the smaller value of the control voltages $+U$ and $-U$ in FIG. 4B the duration of the time intervals $(t_2, t_1+T/2)$ and $(t_3, t_1+T)$ with the time constant $\tau_1$ is smaller than in FIG. 4A and on the other hand the duration of the time intervals $(t_1, t_2)$ and $(t_1+T/2, t_3)$ with the smaller time constant $\tau_2$ is greater than in FIG. 4A. The result is that the duration of the oscillation period T in the case of FIG. 4B is smaller than in the case of FIG. 4A. The frequency $f=1/T$ of the output voltage of the VCO in FIG. 3 can thus be simply varied by varying the two control voltages $+U$ and $-U$ symmetrically with respect to the mean value 0 of the capacitor voltage (thus the value 0 of the threshold voltage of the first signal inverter $I_1$), whilst maintaining the symmetrical signal shape of the capacitor voltage and thus of the output voltage.

On the basis of this symmetry, the duration of the oscillation period T as a function of the magnitude U of the control voltages can be derived from the duration of the time intervals $(t_1, t_2)$ and $(t_2, t_1+T/2)$, which can be determined in a way similar to the one described for the oscillator represented in FIG. 1. This deriving is very simple, but owing to its length it is deemed sufficient in this case to mention the relationship between the period T and the magnitude U of the control voltages:

$$T=2\tau_2 \ln [3+(2-U/E)R_1/R_2]+2(\tau_1-\tau_2) \ln [1+U/E]$$

in which $\tau_1$ and $\tau_2$ are the aforementioned time constants with:

$$\tau_1=R_1C_1$$

$$\tau_2=R_1R_2C_1/(R_1+R_2).$$

From the above relationship as well as the time diagrams of FIGS. 4A and 4B it appears that the magnitude of the control voltages for controlling the duration of the period T should be situated between the values $U=0$ and $U=2E$, the range between the values $U=0$ and $U=E$ being the most important range in practice.

Although the above explanation of the VCO in FIG. 3 has been given for signal inverters $I_1$, $I_2$ and diodes $D_1$, $D_2$ with supposedly ideal properties, the deviations from these ideal properties which prove to be unavoidable in practice, appear not to have any substantial effect on the frequency and the symmetrical signal shape of the output voltage of the VCO. For example, the technically available signal inverters generally have such a low-value output impedance that the active elements of these inverters do not substantially affect the VCO frequency which is set by the control voltages. This also apoplies to the diodes of the control circuit, because the differences in the forward voltage of two diodes of the same type are generally little and these differences can practically be disregarded for two diodes from one and the same wafer.

Figure 5:
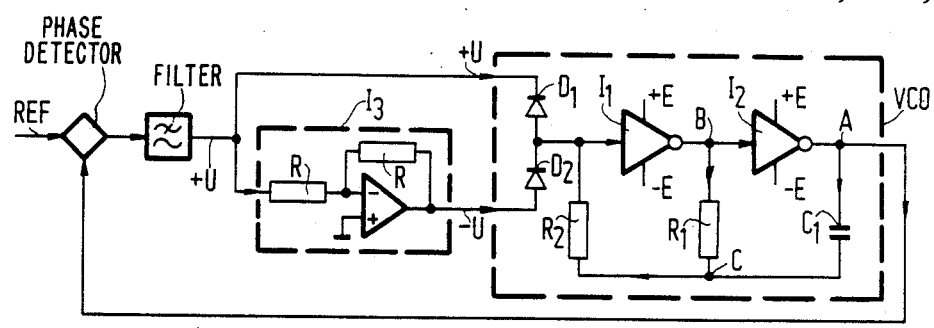
FIG. 5 shows a circuit diagram of a PLL in which is included a VCO according to FIG. 3.

The control circuit of the VCO according to the invention which is easy to implement renders this VCO also attractive for use in closed control systems such as phase-locked loops (PLL's). For illustration, FIG. 5 shows how the VCO according to FIG. 3 can be included in a simple way in a PLL, corresponding elements in FIG. 3 and FIG. 5 being denoted by the same reference numerals. In addition to this VCO the PLL of FIG. 5 includes a phase detector PD which produces an error signal which is representative of the phase difference between a reference signal REF and the binary signal at the output A of the VCO. This error signal is applied to a loop filter LF for obtaining the control voltage $+U$ which is fed to the control input of diode $D_1$ in the VCO. The control voltage $-U$ for the control input of diode $D_2$ is derived from the control voltage $+U$ at the output of loop filter LF with the aid of a signal inverter $I_3$. The signal inverter $I_3$ in FIG. 5 is arranged in a known manner with the aid of an operational amplifier, whose non-inverting input is coupled to earth and whose output is fed back via a resistor R to its inverting input which is connected to the output of loop filter LF via an equally large resistor R. In the explanation of the VCO in FIG. 3 it was assumed that its control voltages $+U$ and $-U$ originate from substantially ideal voltage sources with a very low internal impedance. As regards the control voltage $-U$, this condition is satisfied, since signal inverter $I_3$ in FIG. 5 usually has a very low output impedance. As regards the control voltage $+U$, this condition is satisfied in a simple way by arranging loop filter LF as an active low-pass filter that also includes an operational amplifier.

In the embodiments of the VCO according to the invention described so far, the signal inverters $I_1$ and $I_2$ are arranged as hard-limiting inverting amplifiers, the voltage levels being determined by a positive control voltage $+E$ and an equally large negative supply voltage $-E$ and the threshold voltage at the input having the value 0. These signal inverters, however, can also be arranged as inverting logic gates known as NOT-gates. In many currently used logic gates, one of the voltage levels of the binary output voltage is determined by the supply voltage (positive or negative), whereas the other voltage level is determined by the earth potential and thus has the value 0. In that case the threshold voltage at the input of the logic gate is equal to half the supply voltage. When a NOT-gate used thus is incorporated as signal inverter $I_1$, $I_2$ in the VCO of FIG. 3, the means value of the capacitor voltage in junction C is also equal to half the supply voltage. For obtaining a symmetrical signal shape of the voltage at output A of the VCO, the control voltages for the diodes $D_1$, $D_2$ should be symmetrical with respect to this half control voltage. It will be evident that this shift of the control voltages over the half supply voltage does not in any way affect the operation of the VCO as has been explained hereinbefore.

Figure 6:
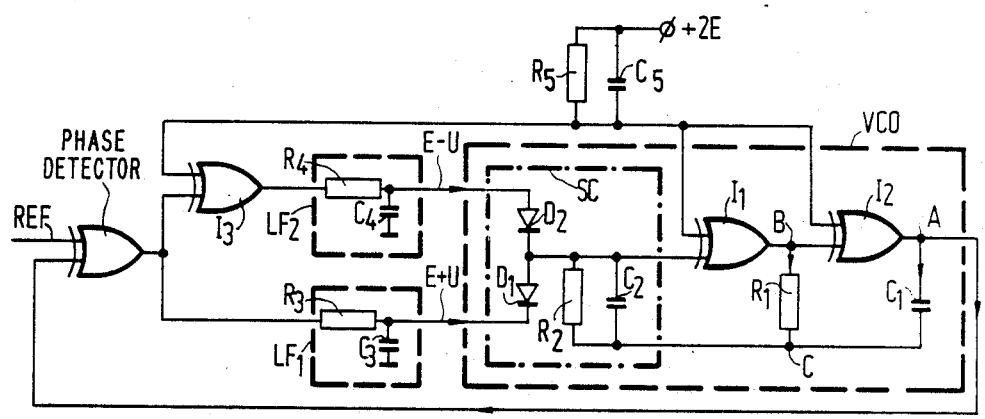
FIG. 6 shows in greater detail a circuit diagram of a PLL in which is included a second embodiment of the VCO according to the invention.

FIG. 6 shows a second embodiment of a VCO according to the invention which, as in FIG. 5, forms a part of a PLL and enables an attractive use of the PLL as a whole because of a special choice of the signal inverters $I_1$, $I_2$ in the VCO. Corresponding elements in FIG. 3, FIG. 5 and FIG. 6 are denoted by the same references numerals.

In FIG. 6, each of the inverters $I_1$, $I_2$ of the VCO is arranged as an EXOR gate with two inputs, at the one input a direct voltage being permanently present representing a logic value "1" and the other input constituting the signal input proper. With the EXOR gate shown in FIG. 6 the voltage level of this logic value "1" is formed by a positive supply voltage +2E, the voltage level of the logic value "0" being formed by the earth potential having the value 0. The threshold voltage at the input of the EXOR gate is thus equal to half the supply voltage +E. The permanent supply of the logic value "1" to one of the two inputs of EXOR gates $I_1$, $I_2$ is effected in FIG. 6 by connecting the supply voltage +2E to the associated input through the parallel circuit of a resistor $R_5$ and a decoupling capacitor $C_5$.

The phase detector PD of the PLL in FIG. 6 is now also arranged as an EXOR gate with two inputs, at the one input a substantially binary reference signal REF and at the other input the binary VCO output voltage (the voltage levels of the two signals at the inputs of this EXOR gate have the values +2E and 0). At the output of the EXOR gate PD, a binary error voltage occurs which is representative of a phase difference between the binary reference signal voltage REF and the binary VCO output voltage (also the voltage levels at the output of this EXOR gate have the values +2E and 0). This binary error voltage at the output of EXOR gate PD is now logically inverted by means of a signal inverter $I_3$, which is also arranged as an EXOR gate, whose one input is connected to the supply voltage +2E through the parallel circuit of resistor $R_5$ and decoupling capacitor $C_5$ and whose other input receives the error voltage to be inverted. The error voltage at the output of EXOR gate PD and the inverted error voltage at the output of EXOR gate $I_3$ are now applied to identically arranged passive low-pass filters $LF_1$ and $LF_2$, respectively, for producing the respective control voltages (E+U) and (E−U) for the diodes $D_1$ and $D_2$ of the VCO. These control voltages are symmetrical with respect to the half supply voltage +E which forms the threshold voltage of EXOR gate $I_1$. Each of the low-pass filters $LF_1$, $LF_2$ in FIG. 6 is formed by a RC-network comprising a series resistance $R_3$, $R_4$ between input and output and the capacitor $C_3$, $C_4$ between output and earth.

In the explanation of the first embodiment of the VCO according to the invention with reference to FIG. 3, it was assumed that the control voltages for the diodes $D_1$ and $D_2$ originate from substantially ideal voltage sources having a very low internal impedance. When using the second embodiment of the VCO according to the invention in the PLL of FIG. 6, these control voltages are produced from the error voltage and the inverted error voltage at the output of the EXOR gates PD and $I_3$ with the aid of passive low-pass filters $LF_1$ and $LF_2$ in the form of identically arranged RC-networks. Since the EXOR gates have a very low output resistance in practice, it can be stated that the control voltages (E+U) and (E−U) in FIG. 6 originate from the voltage sources with an internal resistance which is provided in practice by the series resistances $R_3$, $R_4$ of the low-pass filters $LF_1$, $LF_2$. The effect of the (mutually identical) internal resistances of the two voltage sources on the operation of the VCO in FIG. 6 can be simply allowed for by basing the dimensioning on an enhancement of the value of resistor $R_2$ by the value of the internal resistance of the voltage sources which is provided in practice by the value of the mutually identical resistors $R_3$ and $R_4$. For, in the case when diode $D_1$ is conductive, capacitor $C_1$ is discharged on the one hand through resistor $R_1$ and on the other through the series arrangement of the resistors $R_2$ and $R_3$. For the case of a conductive diode $D_2$ it also holds that capacitor $C_1$ is charged on the one hand through resistor $R_1$ and discharged on the other through the series arrangement of the resistors $R_2$ and $R_4$. Furthermore, the symmetrical signal shape of the output voltage is not affected because the internal resistance of the two control voltage sources in fIG. 6 has one and the same value.

In the practical implementation of the VCO in FIG. 6, resistor $R_2$ is bridged by a capacitor $C_2$. This capacitor $C_2$ promotes as fast passing through of the (very small) input voltage range for which EXOR gate $I_1$ has a large voltage gain and hence avoids when exceeding the threshold voltage of EXOR gate $I_1$ the occurrence of brief parasitic very high frequency oscillation as a consequence of crosstalk of signals both inside and outside this gate to the input thereof. Without this capacitor $C_2$ the threshold voltage of EXOR gate $I_1$ is exceeded too slowly as a result of the relatively large time constant of resistor $R_2$ and the total effective capacity at the input of EXOR gate $I_1$ in the range of the large voltage gain. The capacitance of this capacitor $C_2$ is substantially determined by the type of EXOR gate used, irrespective of the desired oscillation frequency $f=1/T$ of the VCO.

Thus, the special choice of the inverters $I_1$, $I_2$ in the second embodiment of the VCO according to the invention enables one to incorporate the PLL as a whole with the aid of four EXOR gates, a pair of diodes, five resistors and five capacitors. In addition, the use of four EXOR gates provides the practical advantage that only a single example of a current type of integrated circuit known by the name of "Quad EXOR Gate" will suffice. Such "Quad EXOR Gates" with four EXOR gates are available as standard components in the known circuit techniques, including also the ECL technique which can be implemented for a PLL which is to function in the frequency range around 100 MHz.

For the purpose of illustration, the details are stated hereinbelow of a practical implementation of a PLL according to FIG. 6 which is arranged for synchronizing the oscillator signal with a 4.096 MHz reference signal:

| EXOR $I_1$, $I_2$, $I_3$, PD: | | Quadruple EXOR Gate Type PC74HC86 (PHILIPS) 2E = 5 Volts |
|---|---|---|
| Diodes ($D_1$, $D_2$): | | Double diode in series Type BAV99 (PHILIPS) |
| $R_1$: | 2700 Ω | $C_1$: | 33 pF |
| $R_2$: | 1300 Ω | $C_2$: | 6.8 pF |
| $R_3 = R_4$: | 1300 Ω | $C_3 = C_4$: | 47 nF |
| $R_5$: | 12 Ω | $C_5$: | 47 nF |

Figure 7:
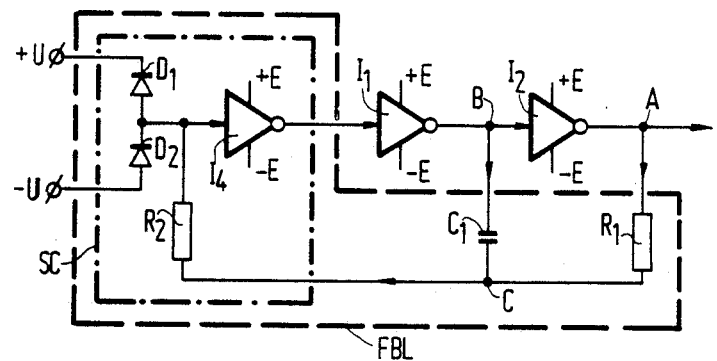
FIG. 7 shows a circuit diagram of a third embodiment of the VCO according to the invention using a slightly different basic oscillator from that according to FIG. 1.

All embodiments of the VCO according to the invention described so far are based on the basic oscillator shown in FIG. 1. However, the invention is not restricted thereto, but can also be applied in a VCO which uses a different basic oscillator. For illustration, FIG. 7 shows a VCO according to the invention based on an oscillator having a fixed frequency such as known from FIG. 1 of the already cited U.S. Pat. No. 4,146,849. Corresponding elements in FIG. 3 and FIG. 7 are denoted by the same reference numerals.

The VCO according to FIG. 7 differs from that according to FIG. 3 as regards the connection of resistor $R_1$ and capacitor $C_1$ to the output of the signal inverters $I_1$ and $I_2$, in FIG. 7 resistor $R_1$ being connected to output A of second inverter $I_2$ and capacitor $C_1$ to output B of first inverter $I_1$. The junction C of resistor $R_1$ and capacitor C, is coupled to the input of the first inverter $I_1$ through a control circuit SC that comprises an additional signal inverter $I_4$ between the junction of diodes $D_1$, $D_2$ and resistor $R_2$ and the input of first inverter $I_1$. This additional inverter $I_4$ is arranged in the same way as the inverters $I_1$ and $I_2$. As can be verified in an easy way with reference to the signal shape of the voltages in the junctions A, B and C of the VCO according to FIG. 7, this additional inverter $I_4$ is required to meet the condition for oscillation, but there is no further basic difference in operation between the VCO's according to FIG. 3 and FIG. 7. Since the VCO according to FIG. 7 should comprise an additional inverter $I_4$, a VCO according to FIG. 3 is to be preferred.

I claim:

1. A voltage controlled oscillator, comprising:
   a series arrangement of a first and a second signal inverter, each signal inverter producing a substantially binary signal with preset voltage levels and the output of the second signal inverter operating as the output of the oscillator; and
   a feedback loop comprising:
      a resistor whose one end is connected to the output of one of the signal inverters and a capacitor whose one end is connected to the output of the other signal inverter and whose remaining interconnected ends are connected to the input of the first signal inverter through a coupling circuit; and
      a control circuit for varying the frequency of the oscillator over a continuous range in accordance with a continuously variable control voltage;
   characterized in that the control circuit forms a part of the coupling circuit and comprises:
      a second resistor whose one end is connected to the interconnected ends of the first resistor and the capacitor; and
      a series arrangement of two equally directed diodes, whose interconnected electrodes are connected to the other end of the second resistor and whose remaining electrodes form the respective control inputs for two oppositely varying control voltages having a symmetrical position with respect to the mean value of the voltages in the interconnected ends of the first resistor and the capacitor, the interconnected electrodes of the diodes being coupled to the input of the first signal inverter.

2. A voltage controlled oscillator as claimed in claim 1, characterized in that each of the signal inverters is arranged as an EXOR gate having two inputs, a direct voltage representing a logic value "1" being constantly present at one of the inputs and the other input constituting the signal input.

3. A phase-locked loop comprising a signal controlled oscillator, a phase detector for generating an error signal which is representative of a phase difference between a reference signal and a signal taken from the oscillator and a loop filter for producing from the error signal a control signal for the signal controlled oscillator;
   the oscillator comprising a series arrangement of a first and a second EXOR gate, each producing a substantially binary signal with present voltage levels and the output of the second EXOR gate operating as the output of the oscillator, and a feedback loop;
   the feedback loop comprising a coupling circuit and a resistor whose one end is connected to the output of the first EXOR gate and a capacitor whose one end is connected to the output of the second EXOR gate and whose remaining interconnected ends are connected to the input of the first EXOR gate through the coupling circuit;
   the coupling cirucit comprising a control circuit for varying the frequency of the oscillator over a continuous range in accordance with a continuously variable control voltage;
   the control circuit comprising a second resistor whose one end is connected to the interconnected ends of the first resistor and the capacitor, and a series arrangement of two equally directed diodes, whose interconnected electrodes are connected to the other end of the second resistor and whose remaining electrodes form the respective control inputs for two oppositely varying control voltages having a symmetrical position with respect to the mean value of the voltages in the interconnected ends of the first resistor and the capacitor, the interconnected electrodes of the diodes being coupled to the input of the first signal inverter;
   the phase detector comprising an EXOR gate with a first input for a substantially binary reference signal voltge and a second input for the substantially binary output voltage of the oscillator, and having an ouput which is connected to one of the control inputs of the oscillator through a first passive low-pass filter and to the other control input of the oscillator through an EXOR gate operating as a logic signal inverter and a subsequent second passive low-pass filter corresponding to the first low-pass filter.

* * * * *